US012578813B2

(12) United States Patent
Liu

(10) Patent No.: US 12,578,813 B2
(45) Date of Patent: Mar. 17, 2026

(54) TOUCH DISPLAY SUBSTRATE, MANUFACTURING METHOD THEREFOR, AND TOUCH DISPLAY DEVICE

(71) Applicants: Chengdu BOE Optoelectronics Technology Co., Ltd., Chengdu (CN); BOE Technology Group Co., Ltd., Beijing (CN)

(72) Inventor: Guo Liu, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 1087 days.

(21) Appl. No.: 17/630,517

(22) PCT Filed: Mar. 19, 2021

(86) PCT No.: PCT/CN2021/081887
§ 371 (c)(1),
(2) Date: Jan. 27, 2022

(87) PCT Pub. No.: WO2022/193315
PCT Pub. Date: Sep. 22, 2022

(65) Prior Publication Data
US 2023/0359300 A1 Nov. 9, 2023

(51) Int. Cl.
*G06F 3/041* (2006.01)
*H10K 59/12* (2023.01)
*H10K 59/40* (2023.01)

(52) U.S. Cl.
CPC ................... *G06F 3/04164* (2019.05); *G06F 2203/04103* (2013.01); *H10K 59/1201* (2023.02); *H10K 59/40* (2023.02)

(58) Field of Classification Search
CPC ...... G06F 3/04164; G06F 2203/04103; H10K 59/1201; H10K 59/40
(Continued)

(56) References Cited

U.S. PATENT DOCUMENTS 10,782,840 B1 * 9/2020 Lin ..................... G06F 3/04166
2013/0207899 A1 8/2013 Wang et al.
(Continued)

FOREIGN PATENT DOCUMENTS

CN 103927048 A 7/2014
CN 104571720 A 4/2015
(Continued)

*Primary Examiner* — Kwin Xie
(74) *Attorney, Agent, or Firm* — Ling Wu; Stephen Yang; Ling and Yang Intellectual Property

(57) ABSTRACT

A touch display substrate, a manufacturing method therefor, and a touch display device are provided. The touch display substrate includes an active area and a first peripheral area and a second peripheral area located at peripheries of the active area, the second peripheral area includes a first binding area used for binding a driver chip and a second binding area located at one side of the first binding area away from the active area and used for binding a flexible circuit board; the first binding area includes a first gate drive circuit pin area and a first touch pin area; the second binding area includes a second gate drive circuit pin area electrically connected to the first gate drive circuit pin area and a second touch pin area electrically connected to the first touch pin area.

14 Claims, 7 Drawing Sheets

(58) Field of Classification Search
    USPC .................................................. 345/173–174
    See application file for complete search history.

(56)                      References Cited

U.S. PATENT DOCUMENTS

| | | | |
|---|---|---|---|
| 2016/0370945 A1 | 12/2016 | Qu | |
| 2017/0255287 A1* | 9/2017 | Huang | ................... G06F 3/0445 |
| 2017/0269744 A1 | 9/2017 | Gharghi et al. | |
| 2018/0032188 A1* | 2/2018 | Park | ...................... G06F 3/0446 |
| 2018/0321764 A1 | 11/2018 | Oh | |
| 2018/0356683 A1* | 12/2018 | Higano | ............... G06F 3/04164 |
| 2019/0025956 A1* | 1/2019 | Lee | ..................... G06F 3/04164 |
| 2020/0192542 A1 | 6/2020 | Chang et al. | |
| 2020/0219941 A1 | 7/2020 | Chiang et al. | |
| 2021/0064162 A1* | 3/2021 | Yin | ................... G02F 1/134318 |
| 2021/0200366 A1* | 7/2021 | Bok | ...................... G06F 3/0412 |
| 2021/0357094 A1 | 11/2021 | Qiao et al. | |
| 2022/0066609 A1 | 3/2022 | Han et al. | |
| 2022/0173091 A1 | 6/2022 | Kim et al. | |

FOREIGN PATENT DOCUMENTS

| | | |
|---|---|---|
| CN | 205451004 U | 8/2016 |
| CN | 106292025 A | 1/2017 |
| CN | 206178742 U | 5/2017 |
| CN | 108415601 A | 8/2018 |
| CN | 108878474 A | 11/2018 |
| CN | 111090358 A | 5/2020 |
| CN | 111312099 A | 6/2020 |
| CN | 111414099 A | 7/2020 |
| CN | 112035013 A | 12/2020 |
| KR | 1020170124670 A | 11/2017 |
| WO | 2020189894 A1 | 9/2020 |

* cited by examiner

1

TOUCH DISPLAY SUBSTRATE, MANUFACTURING METHOD THEREFOR, AND TOUCH DISPLAY DEVICE

CROSS-REFERENCE TO RELATED APPLICATION

This application is a national stage application of PCT Application No. PCT/CN2021/081887, which is filed on Mar. 19, 2021, the content of which should be interpreted as being hereby incorporated by reference.

TECHNICAL FIELD

Embodiments of the present disclosure relate to, but are not limited to, the field of display technology, and more particularly, to a touch display substrate, a manufacturing method therefor, and a touch display device.

BACKGROUND

An Organic Light Emitting Diode (OLED) is an active light emitting display device, which has the advantages of self-luminescence, wide viewing angle, high contrast ratio, low power consumption, extremely high response speed and so on. With the continuous development of a display technology, a display device that uses an OLED as a light emitting element and controls signals through a Thin Film Transistor (TFT) has become a mainstream product in the field of display at present.

SUMMARY

The following is a summary about the subject matter described herein in detail. The summary is not intended to limit the protection scope of the claims.

An embodiment of the present disclosure provides a touch display substrate, which includes an active area and a first peripheral area and a second peripheral area located at peripheries of the active area, wherein the active area includes a base, and a display unit and a touch unit stacked on the base, the display unit includes a plurality of data lines, a plurality of gate lines and a plurality of sub-pixels, and the touch unit includes a plurality of touch electrodes and touch leads connected to the touch electrodes; the first peripheral area includes a gate drive circuit connected to the plurality of gate lines; the second peripheral area includes a first binding area used for binding a driver chip and a second binding area located at one side of the first binding area away from the active area and used for binding a flexible circuit board; the first binding area includes a first gate drive circuit pin area and a first touch pin area; the second binding area includes a second gate drive circuit pin area electrically connected to the first gate drive circuit pin area and a second touch pin area electrically connected to the first touch pin area; the second peripheral area further includes touch test leads connecting the first touch pin area with the second touch pin area, and array test leads connecting the first gate drive circuit pin area with the second gate drive circuit pin area, and an orthographic projection of the array test leads on the base does not overlap with an orthographic projection of the touch test leads on the base.

In an exemplary embodiment, the first binding area includes a first side edge, a second side edge opposite to the first side edge, and a third side edge and a fourth side edge connected between the first side edge and the second side edge, the first side edge is located at one side close to the active area and the second side edge is located at the other side away from the active area; the first gate drive circuit pin area includes a first sub-gate drive circuit pin area, the first sub-gate drive circuit pin area is located at one side close to the first side edge, and the first sub-gate drive circuit pin area is disposed close to the third side edge or the fourth side edge; the first touch pin area includes a first sub-touch pin area, the first sub-touch pin area is located at one side close to the third side edge or the fourth side edge, and a distance between the first sub-touch pin area and the second side edge is smaller than a distance between the first sub-gate drive circuit pin area and the second side edge.

In an exemplary embodiment, the first binding area further includes an input pin area and a first output pin area, wherein the input pin area is disposed close to the second side edge and the first output pin area is disposed close to the first side edge.

In an exemplary embodiment, the first output pin area includes a first sub-output pin area and a gap area located at one side of the first sub-output pin area; the first binding area further includes a plurality of first touch leads, and the first touch leads are connected to the touch electrodes in the active area after extending from the first sub-touch pin area and passing through the gap area.

In an exemplary embodiment, the first binding area further includes a plurality of virtual pins, and the virtual pins are disposed in or at any one or more of: the first sub-touch pin area and one side or both sides of at least one of the first touch leads.

In an exemplary embodiment, the first sub-touch pin area includes a plurality of first touch pins, and one or more of the plurality of first touch pins are connected to the first touch leads.

In an exemplary embodiment, the plurality of first touch pins includes two or more than two columns of first touch pins, and the first touch pins in each column and the first touch pins in its adjacent columns are arranged alternately in a first direction.

In an exemplary embodiment, in a plane perpendicular to the touch display substrate, the first touch pins include a first metal layer disposed on the base, a second metal layer disposed on the first metal layer, and a third metal layer disposed on the second metal layer; in the plane perpendicular to the touch display substrate, the first touch leads include the first metal layer disposed on the base.

In an exemplary embodiment, the second binding area includes a fifth side edge, a sixth side edge opposite to the fifth side edge, and a seventh side edge and an eighth side edge connected between the fifth side edge and the sixth side edge, the fifth side edge is located at one side close to the first binding area and the sixth side edge is located at the other side away from the first binding area; the second gate drive circuit pin area includes a third sub-gate drive circuit pin area, and the second touch pin area includes a third sub-touch pin area; the third sub-gate drive circuit pin area and the third sub-touch pin area are located at one side of the second binding area close to the seventh side edge, and a distance between the third sub-gate drive circuit pin area and the seventh side edge is smaller than a distance between the third sub-touch pin area and the seventh side edge.

In an exemplary embodiment, the second binding area further includes a power pin area, wherein the power pin area is located between the third sub-gate drive circuit pin area and the third sub-touch pin area.

In an exemplary embodiment, the touch display substrate further includes a first power line and a second power line, the first power line extends from the power pin area to the active area, and the second power line extends from the power pin area to the first peripheral area; the orthographic projection of the array test leads on the base overlaps with an orthographic projection of one or more of the first power line and the second power line on the base.

In an exemplary embodiment, the second peripheral area includes a first area and a second area, the first area is located between the second binding area and the second area, and a distance between the array test leads and the touch test leads in the first area is smaller than a distance between the array test leads and the touch test leads in the second area.

In an exemplary embodiment, in the first area, the orthographic projection of one or more of the first power line and the second power line on the base is located between the orthographic projection of the array test leads on the base and the orthographic projection of the touch test leads on the base.

An embodiment of the present disclosure also provides a touch display device including the touch display substrate according to any one of the embodiments described above.

An embodiment of the present disclosure also provides a method of manufacturing a touch display substrate, wherein touch display substrate includes an active area and a first peripheral area and a second peripheral area located at peripheries of the active area, wherein the second peripheral area includes a first binding area used for binding a driver chip and a second binding area located at one side of the first binding area away from the active area and used for binding a flexible circuit board, the first binding area includes a first gate drive circuit pin area and a first touch pin area, the second binding area includes a second gate drive circuit pin area electrically connected to the first gate drive circuit pin area and a second touch pin area electrically connected to the first touch pin area; the method includes: forming touch test leads and array test leads in the second peripheral area, wherein the touch test leads connect the first touch pin area with the second touch pin area, the array test leads connect the first gate drive circuit pin area with the second gate drive circuit pin area, and an orthographic projection of the array test leads on the base does not overlap with an orthographic projection of the touch test leads on the base.

After the drawings and the detailed description are read and understood, the other aspects may be clear.

BRIEF DESCRIPTION OF DRAWINGS

The drawings are intended to provide a further understanding of technical schemes of the present disclosure and form a part of the specification, and are used to explain the technical schemes of the present disclosure together with the embodiments of the present disclosure, and not intended to form limitations to the technical schemes of the present disclosure. The shapes and sizes of various components in the drawings do not reflect the true proportion, and are only intended to schematically illustrate the contents of the present disclosure.

4

Figure 5:
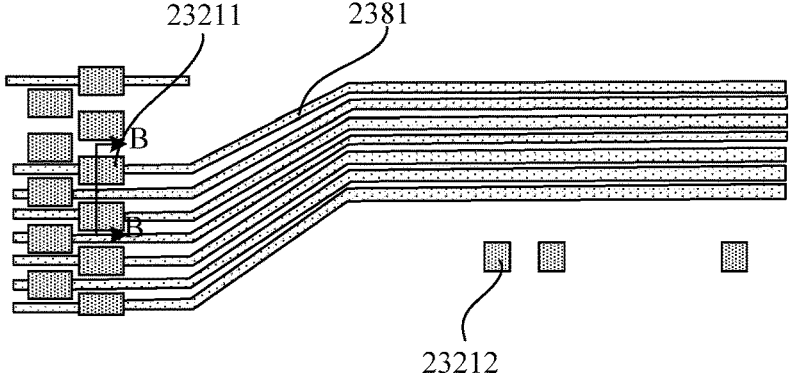
FIG. 5 is an enlarged schematic structure diagram of a touch pin area in FIG. 3 or 4.
Figure 6:
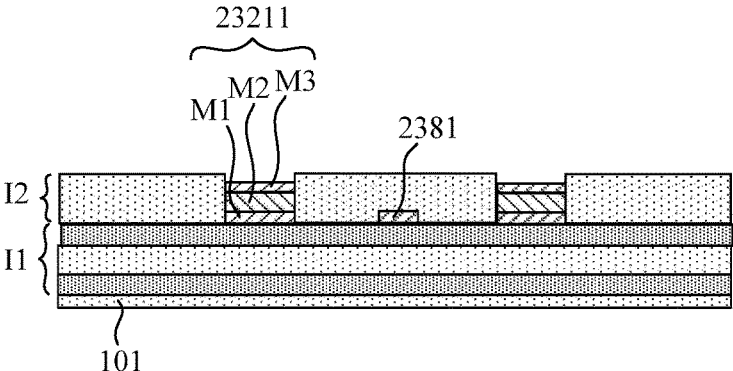
Figure 7:
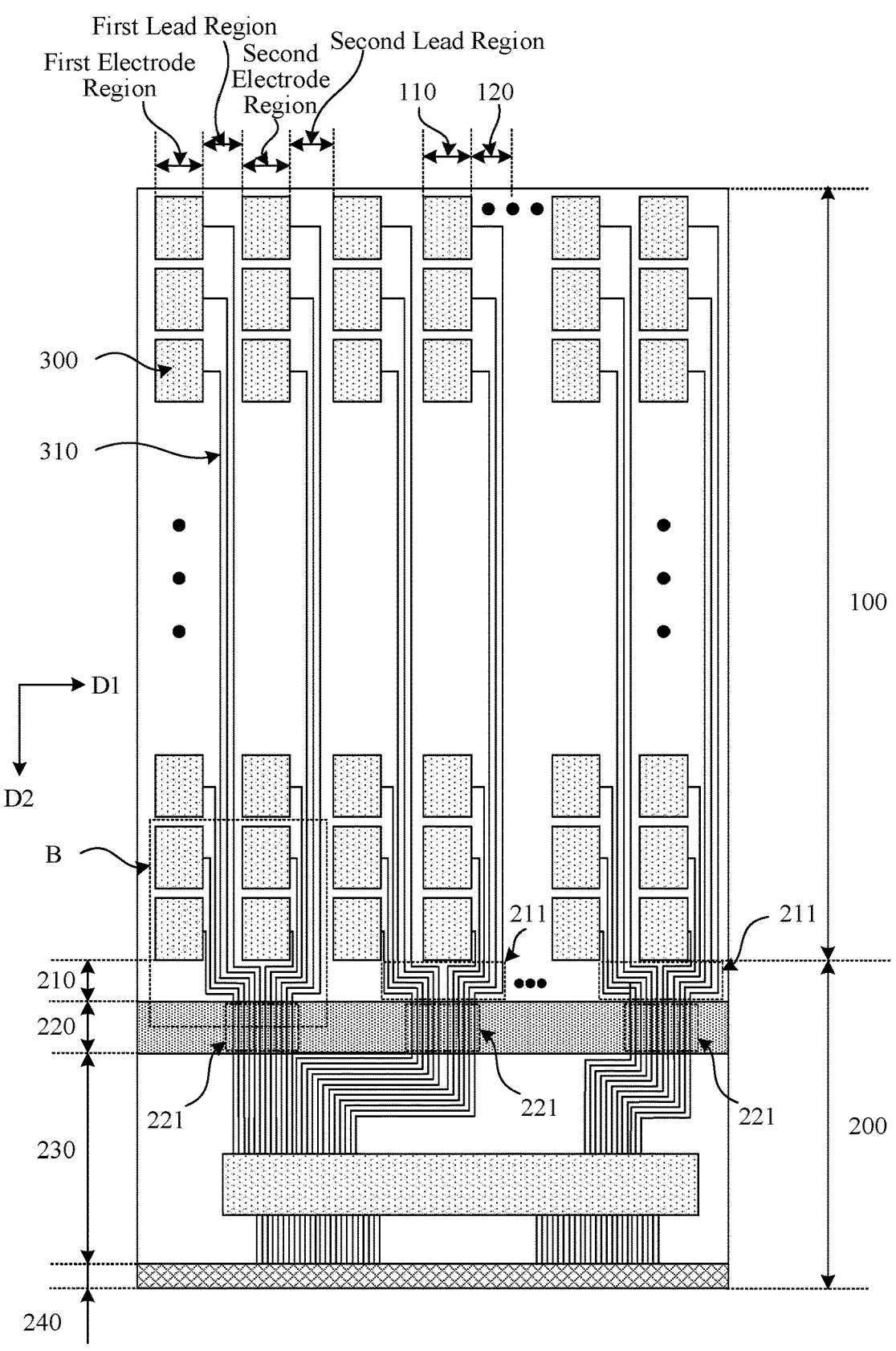
Figure 8:
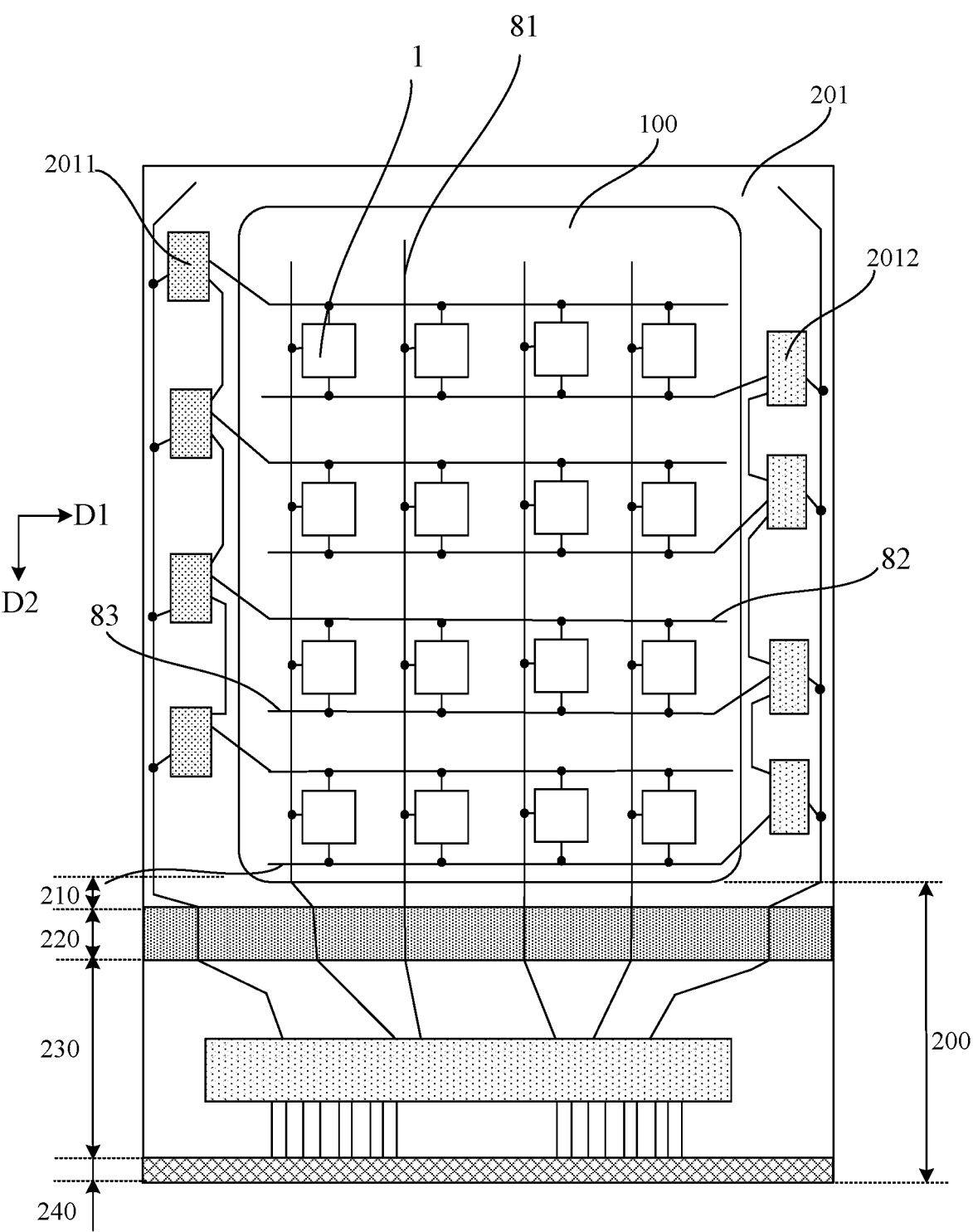
Figure 9:
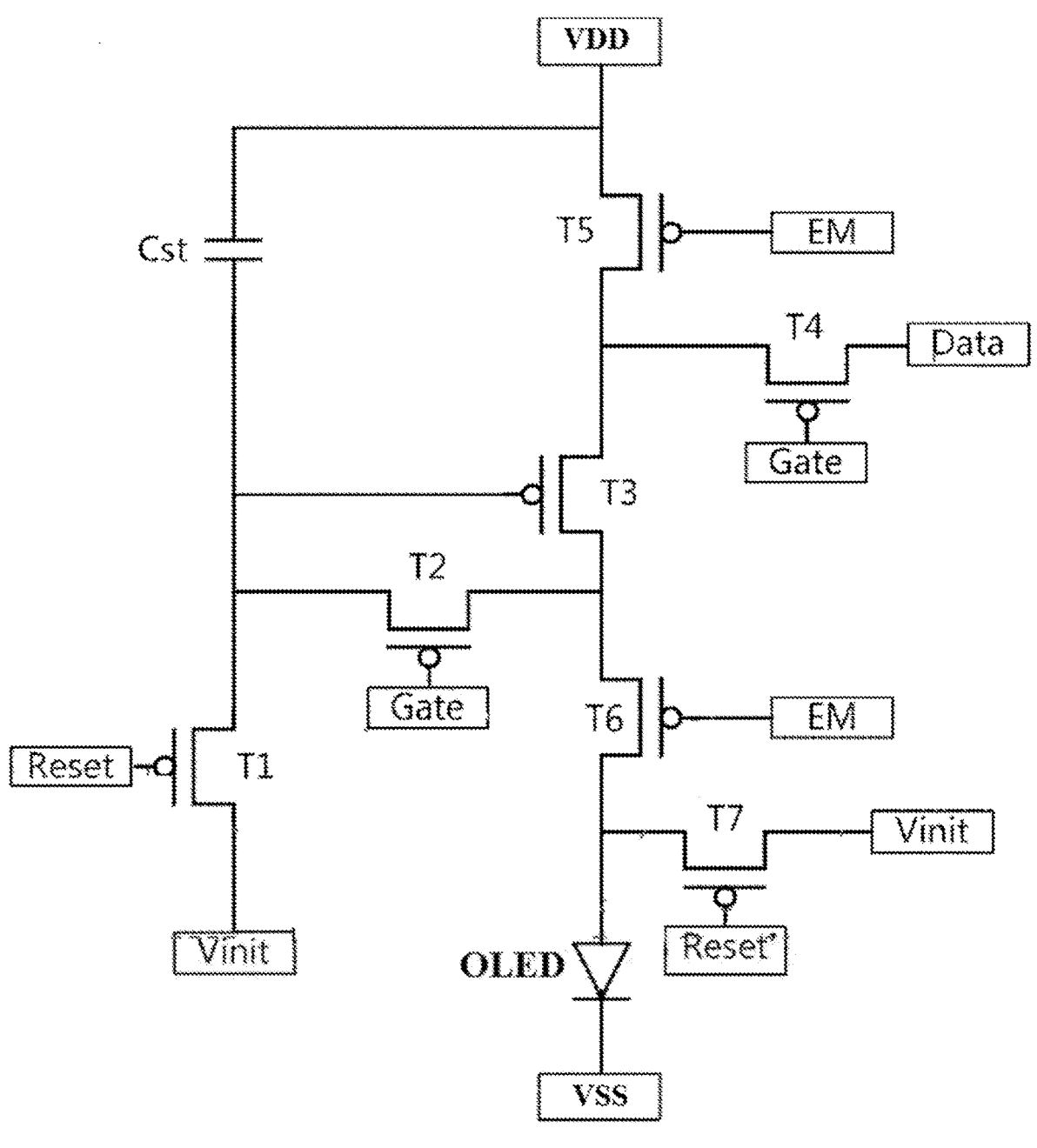
Figure 10:
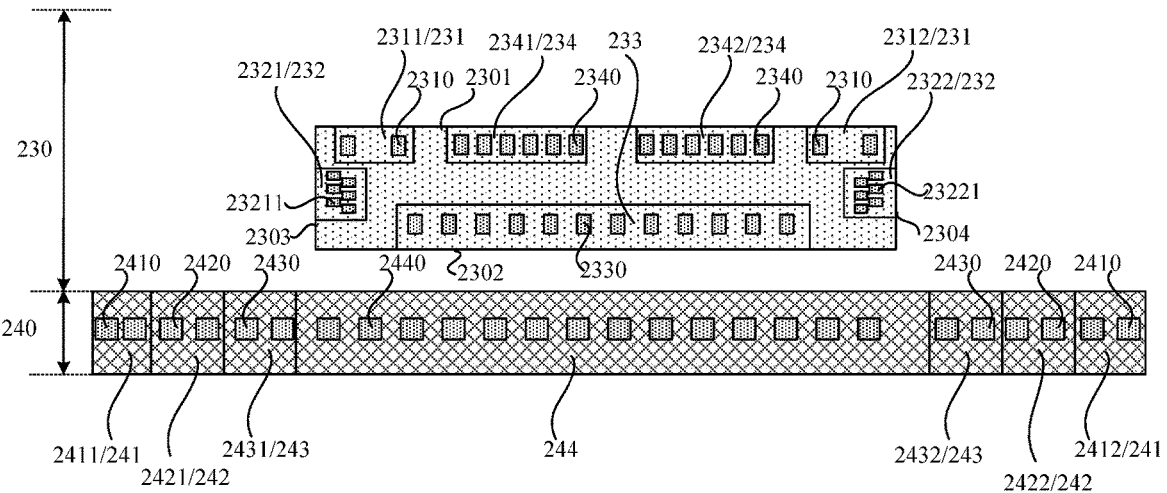
Figure 11:
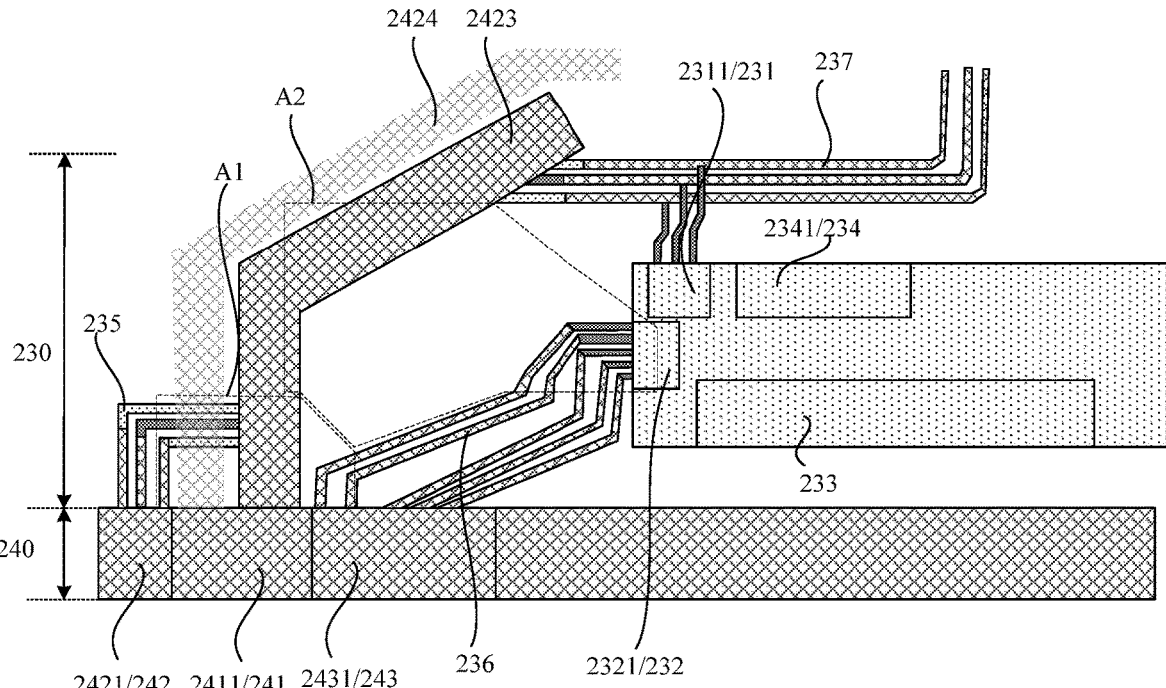

FIG. 6 is a schematic sectional structure diagram of an area BB in FIG. 5;

FIG. 7 is a schematic structure diagram of a touch area of a touch display substrate in accordance with an embodiment of the present disclosure;

FIG. 8 is a schematic structure diagram of a display area of a touch display substrate in accordance with an embodiment of the present disclosure;

FIG. 9 is a schematic structure diagram of a pixel drive circuit in accordance with an embodiment of the present disclosure;

FIG. 10 is the third schematic structure diagram of the first binding area and the second binding area in accordance with an embodiment of the present disclosure; and FIG. 11 is the fourth structural diagram of the first binding area and the second binding area in accordance with an embodiment of the present disclosure.

DETAILED DESCRIPTION

The embodiments of the present disclosure will be described in detail below in combination with the drawings. It is to be noted that their implementations may be carried out in many different forms. Those of ordinary skill in the art can easily understand such a fact that manners and contents may be transformed into various forms without departing from the purpose and scope of the present disclosure. Therefore, the present disclosure should not be explained as being limited to the contents recorded in the following implementations only. The embodiments in the present disclosure and features in the embodiments can be arbitrarily combined with each other without conflicts.

Sometimes for clarity, sizes of various constituent elements, thicknesses of layers or areas in the drawings may be exaggerated. Therefore, one embodiment of the present disclosure is not necessarily limited to the sizes, and the shapes and sizes of various components in the drawings do not reflect the true proportion. In addition, the drawings schematically illustrate ideal examples, and one embodiment of the present disclosure is not limited to the shapes or numerical values shown in the drawings.

Ordinal numerals such as "first", "second", "third" and the like in the specification are set to avoid confusion of the constituent elements, but not to set a limit in quantity.

For convenience, the terms such as "middle", "upper", "lower", "front", "back", "vertical", "horizontal", "top", "bottom", "inside", "outside" and the like indicating orientation or position relationships are used in the specification to illustrate position relationships between the constituent elements with reference to the drawings, and are intended to facilitate description of the specification and simplification of the description, but not to indicate or imply that the mentioned device or element must have a specific orientation or be constructed and operated in a specific orientation, therefore, they should not be understood as limitations to the present disclosure. The position relationships between the constituent elements may be appropriately changed according to directions of various constituent elements described. Therefore, words and phrases used in the specification are not limited and appropriate replacements may be made according to situations.

Unless otherwise specified and defined explicitly, the terms "installed", "coupled" and "connect" should be understood in a broad sense in the specification. For example, the connection may be a fixed connection, a detachable connection or an integrated connection, or may be a mechanical connection or connection, or may be a direct connection, an indirect connection through intermediate components, or communication inside two components. For those skilled in the art, the specific meanings of the above terms in the present disclosure can be understood according to specific situations.

In the specification, a transistor refers to a component which at least includes three terminals, a gate electrode, a drain electrode and a source electrode. The transistor has a channel region between the drain electrode (drain electrode terminal, drain region, or drain) and the source electrode (source electrode terminal, source region, or source), and a current can flow through the drain electrode, the channel region, and the source electrode. It is to be noted that, in the specification, the channel region refers to a region which the current flows mainly through.

In the specification, the first electrode may be a drain electrode, and the second electrode may be a source electrode, or the first electrode may be a source electrode, and the second electrode may be a drain electrode. In the case that transistors with opposite polarities are used or that a current direction is changed during circuit operation, functions of "the source electrode" and "the drain electrode" may sometimes be exchanged. Therefore, "the source electrode" and "the drain electrode" may be exchanged in the specification.

In the specification, "connection" includes a case in which the constituent elements are connected together through an element with a certain electric action. "The element with the certain electric action" is not particularly limited as long as electric signals between the connected constituent elements can be sent and received. Examples of "the element with the certain electric action" include not only an electrode and wire, but also a switching element such as a transistor, a resistor, an inductor, a capacitor, other elements with various functions, etc.

In the specification, "parallel" refers to a state in which an angle formed by two straight lines is greater than −10° and less than 10°, and thus also includes a state in which the angle is greater than −5° and less than 5°. In addition, "vertical" refers to a state in which an angle formed by two straight lines is greater than 80° and less than 100°, and thus also includes a state in which the angle is greater than 85° and less than 95°.

In the present disclosure, "about" means that a boundary is defined not so strictly and numerical values within a process and measurement error range are allowed.

At present, both touch and display functions of smart phones are independently controlled by two chips, and the greatest feature of OLED Touch and Display Driver Integration (TDDI) products is that the touch chip and display chip are integrated into a single chip. TDDI brings a unified system architecture. Because the display chip is separated from the touch chip in the original system architecture, existence of some display noises may be resulted in. However, since TDDI has achieved a unified control, there will be a better effect in noise management.

However, in the design of the binding areas of the OLED TDDI products, if pins are arranged in the conventional arrangement manner, the problem of intersection of touch traces and gate on array (GOA) traces will occur, further causing interference of gate on array signals to touch signals and reducing the touch performance.

Figure 1:
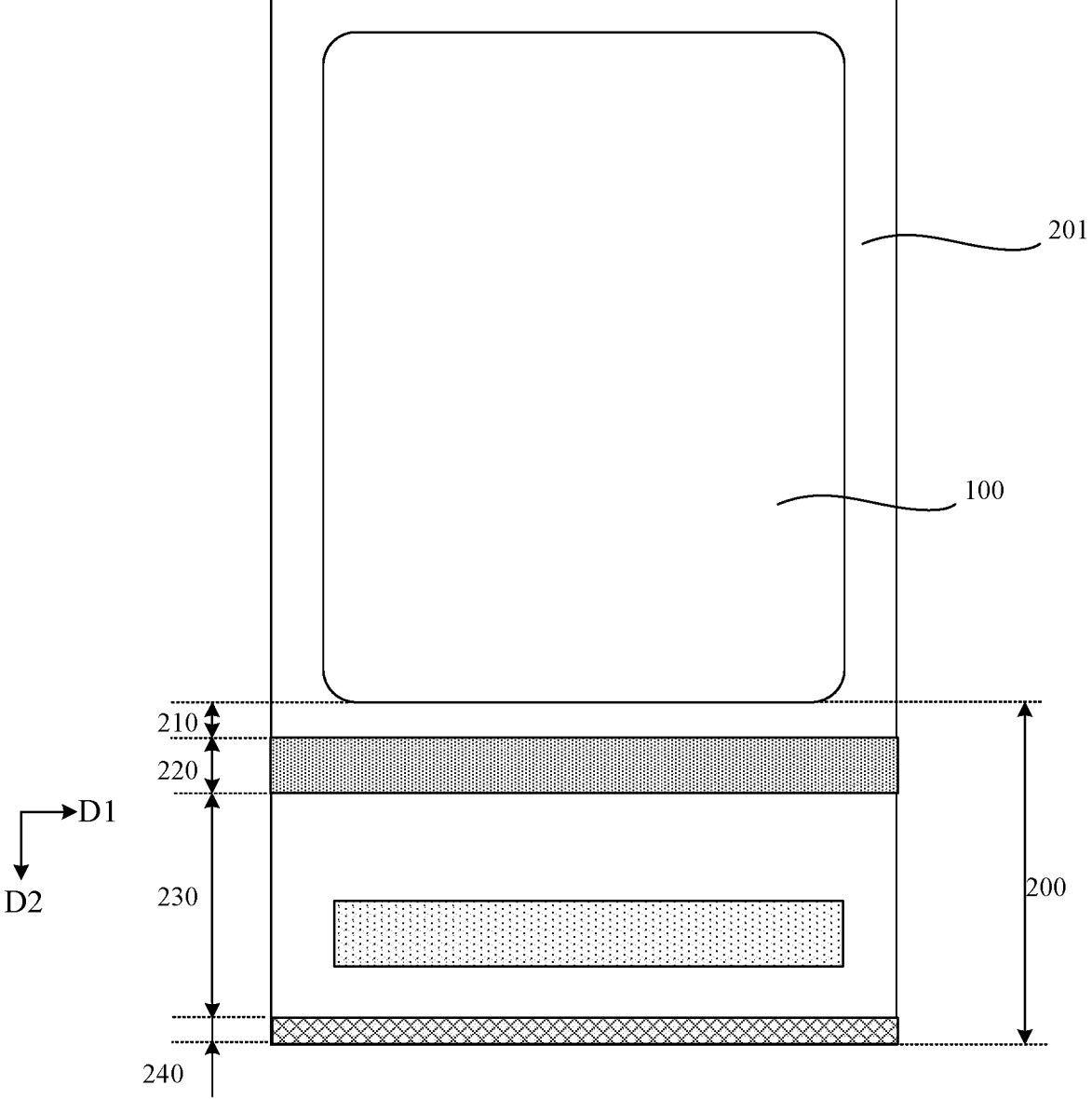
FIG. 1 is a schematic structure diagram of a touch display substrate in accordance with an embodiment of the present disclosure.

FIG. 1 is a schematic planar structure diagram of a touch display substrate in accordance with an exemplary embodiment of the present disclosure. As shown in FIG. 1, the touch display substrate includes a base, an active area (AA) 100 disposed on the base, and a first peripheral area 201 and a second peripheral area 200 located at peripheries of the active area 100.

The active area 100 includes the base (not shown in the figure), a display unit (not shown in the figure) and a touch unit (not shown in the figure) stacked on the base, the display unit includes a plurality of data lines (not shown in the figure), a plurality of gate lines (not shown in the figure) and a plurality of sub-pixels (not shown in the figure), and the touch unit includes a plurality of touch electrodes (not shown in the figure) and touch traces (not shown in the figure) connected to the touch electrodes. In the present embodiment, for the stacked display unit and touch unit, the active area may be a touch area of the touch unit or a display area of the display unit, and both the touch area and the display area refer to the active area in the following description.

The second peripheral area 200 includes a first binding area 230 and a second binding area 240 located at one side of the first binding area 230 away from the active area 100. The first binding area 230 is used for binding a driver chip, and the second binding area 240 is used for binding a flexible printed circuit (FPC) and providing drive signals for an array of pixels in the display unit through the FPC and the driver chip, to implement image display and touch.

Figure 2:
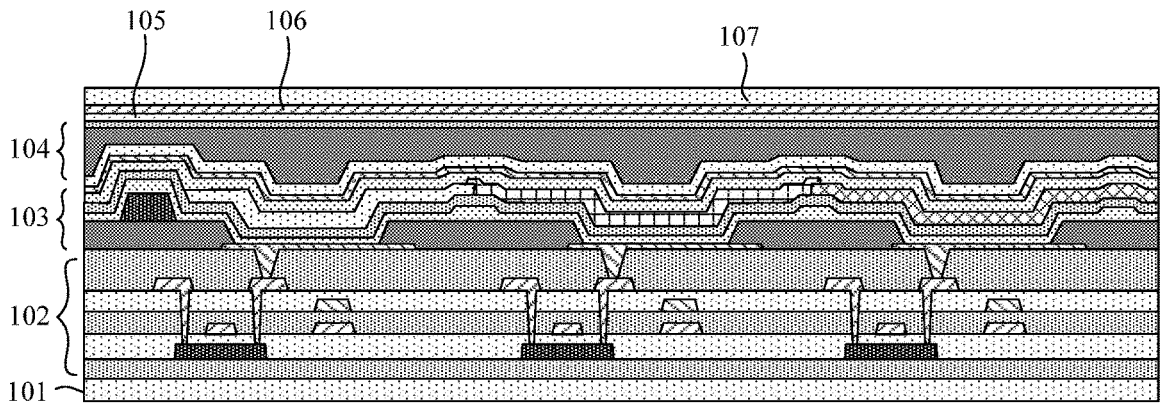
FIG. 2 is a schematic sectional structure diagram of an active area in FIG. 1.

FIG. 2 is a schematic sectional structure diagram of an active area of a touch display substrate in accordance with an exemplary embodiment of the present disclosure, wherein the touch display substrate includes a display unit and a touch unit disposed on the display unit, and the display unit illustrates a structure of three sub-pixels. As shown in FIG. 2, in a plane perpendicular to the touch display substrate, the display unit may include a drive circuit layer 102 disposed on a base 101, a light emitting element 103 disposed at one side of the drive circuit layer 102 away from the base 101, and an encapsulation layer 104 disposed at one side of the light emitting element 103 away from the base 101. In some possible implementations, the display unit may include other film layers, such as spacer posts, which is not limited in the present disclosure.

In an exemplary implementation, the base 101 may be a flexible base or may be a rigid base. The flexible base may include a first flexible material layer, a first inorganic material layer, a semiconductor layer, a second flexible material layer and a second inorganic material layer which are stacked. Materials of the first flexible material layer and the second flexible material layer may be polyimide (PI), polyethylene terephthalate (PET) or surface treated polymer soft films; materials of the first inorganic material layer and the second inorganic material layer may be silicon nitride (SiNx) or silicon oxide (SiOx), for improving the water and oxygen resistance of the base; and a material of the semiconductor layer may be amorphous silicon (a-si).

In an exemplary implementation, the drive circuit layer 102 of each sub-pixel may include a plurality of transistors and a storage capacitor constituting a pixel drive circuit. Each sub-pixel including one drive transistor and one storage capacitor will be described as an example in FIG. 2. In some possible implementations, the driver circuit layer 102 of each sub-pixel may include: a first insulating layer disposed on the base; an active layer disposed on the first insulating layer; and a second insulating layer overlying the active layer; a gate electrode and a first capacitor electrode disposed on the second insulating layer; a third insulating layer overlying the gate electrode and the first capacitor electrode; a second capacitor electrode disposed on the third insulating layer; a fourth insulating layer overlying the second capacitor electrode, via holes being formed in the second insulating layer, the third insulating layer, and the fourth insulating layer and exposing the active layer; a source electrode and a drain electrode disposed on the fourth insulating layer, the source electrode and the drain electrode being connected respectively to the active layer through the via holes; and a planarization layer overlying the aforementioned structures, via holes being formed in the planarization layer and exposing the drain electrode. The active layer, the gate electrode, the source electrode and the drain electrode constitute the drive transistor, and the first capacitor electrode and the second capacitor electrode constitute the storage capacitor.

In an exemplary implementation, the light emitting element 103 may include an anode, a pixel definition layer, an organic light emitting layer and a cathode. The anode is disposed on the planarization layer, and is connected to the drain electrode of the drive transistor through the via holes formed in the planarization layer; the pixel definition layer is disposed on the anode and the planarization layer, and a pixel opening is provided in the pixel definition layer and exposes the anode; the organic light emitting layer is at least partially disposed in the pixel opening, and is connected to the anode; the cathode is disposed on the organic light emitting layer, and is connected to the organic light emitting layer; and the organic light emitting layer emits light of corresponding colors under driving of the anode and the cathode.

In an exemplary implementation, the encapsulation layer 104 may include a first encapsulation layer, a second encapsulation layer and a third encapsulation layer that are stacked; the first encapsulation layer and the third encapsulation layer may be made of inorganic materials, and the second encapsulation layer may be made of organic materials and is disposed between the first encapsulation layer and the third encapsulation layer, so as to ensure that external water vapor cannot enter into the light emitting element 103.

In an exemplary implementation, the organic emitting layer of the OLED may include a light emitting layer (EML), and include one or more of a hole injection layer (HIL), a hole transport layer (HTL), a hole block layer (HBL), an electron block layer (EBL), an electron injection layer (EIL) and an electron transport layer (ETL). Under driving of voltages of the anode and the cathode, light is emitted according to the required gray scale using light emitting properties of the organic materials.

In an exemplary implementation, light emitting layers of OLEDs of different colors are different. For example, a red light emitting element includes a red light emitting layer, a green light emitting element includes a green light emitting layer, and a blue light emitting element includes a blue light emitting layer. In order to decrease the process difficulty and improve the yield, the hole injection layer and hole transport layer located at one side of the light emitting layer may be in the form of common connected layers, and the electron injection layer and the electron transport layer located at the other side of the light emitting layer may be in the form of common connected layers. In an exemplary implementation, any one or more of the hole injection layer, the hole transport layer, the electron injection layer and the electron transport layer may be manufactured by a primary process (primary evaporation process or primary inkjet printing process), but their isolation is implemented by means of differences in surface segments of the formed film layers or by means of surface treatment. For example, any one or more of the hole injection layer, the hole transport layer, the electron injection layer and the electron transport layer corresponding to adjacent sub-pixels may be isolated. In an exemplary implementation, the organic light emitting layer may be formed by evaporation using a fine metal mask (FMM) or an open mask, or formed using an inkjet process.

In an exemplary implementation, as shown in FIG. 2, in a plane perpendicular to the touch display substrate, the touch unit may include a buffer layer 105 disposed at one side of the encapsulation layer 104 away from the base 101, a touch electrode layer 106 disposed at one side of the buffer layer 105 away from the base 101, and a protective layer 107 disposed at one side of the touch electrode layer 106 away from the base 101. A plurality of touch electrodes and touch traces can be disposed on the touch electrode layer 106 simultaneously.

In an exemplary implementation, the buffer layer 105 may be made of any one or more of silicon oxide (SiOx), silicon nitride (SiNx), and silicon oxynitride (SiON), and may be a single layer, multiple layers or a composite layer. The touch electrode layer 106 may be made of metal materials, such as any one or more of silver (Ag), copper (Cu), aluminum (Al), titanium (Ti), and molybdenum (Mo), or alloy materials of the aforementioned metals, and the protective layer 109 may be made of organic materials.

Figure 3:
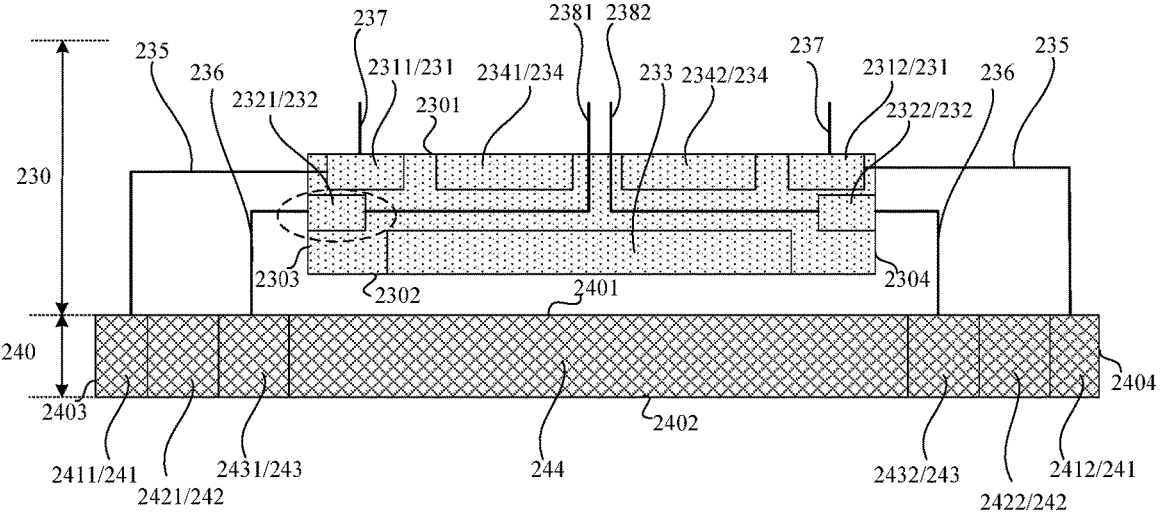
FIG. 3 is the first schematic structure diagram of the first binding area and the second binding area in FIG. 1.
Figure 4:
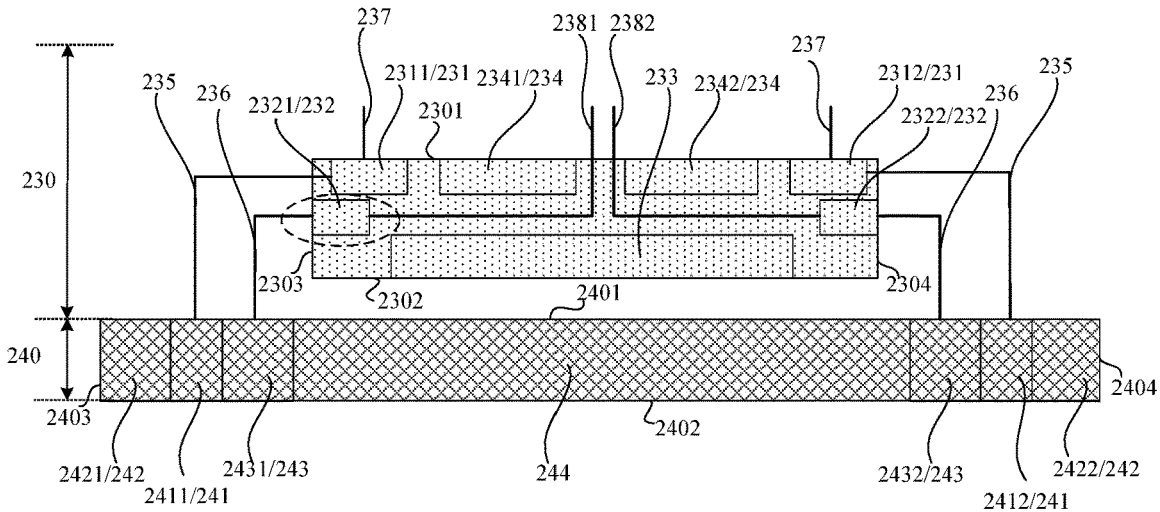
FIG. 4 is the second schematic structure diagram of the first binding area and the second binding area in FIG. 1.

FIGS. 3 and 4 are two schematic structural diagrams of the first binding area 230 and the second binding area 240 in FIG. 1. As shown in FIG. 3 or 4, the first binding area 230 includes a first gate drive circuit pin area 231 used for transmitting drive signals of the driver chip to a gate drive circuit and a first touch pin area 232 for transmitting touch signals sensed by the touch electrodes to the driver chip. The second binding area 240 includes a second gate drive circuit pin area 241 for testing the plurality of gate lines and a second touch pin area 243 for testing the plurality of touch electrodes.

The second peripheral area 200 also includes touch test leads 236 for connecting the first touch pin area 232 with the second touch pin area 243, and array test leads 235 for connecting the first gate drive circuit pin area 231 with the second gate drive circuit pin area 241, and an orthographic projection of the array test leads 235 on the base does not overlap with an orthographic projection of the touch test leads 236 on the base.

Since the numbers of the touch test leads 236 and the array test leads 235 need to be determined according to the actual resolution of the touch display substrate, not all of the touch test leads 236 and the array test leads 235 are shown in FIGS. 3 and 4, and only part of the touch test leads 236 and the array test leads 235 are shown, that is, the numbers of the touch test leads 236 and the array test leads 235 shown in FIGS. 3 and 4 do not represent the actual numbers of the touch test leads 236 and the array test leads 235.

In the touch display substrate in the embodiments of the present disclosure, the orthographic projection of the array test leads 235 on the base does not overlap with the orthographic projection of the touch test leads 236 on the base, so that the problem of signal crosstalk caused by the intersection of the touch traces and gate on array traces is avoided, improving the touch performance.

In an exemplary implementation, as shown in FIG. 3 or 4, the first binding area 230 includes a first side edge 2301, a second side edge 2302 opposite to the first side edge 2301, and a third side edge 2303 and a fourth side edge 2304 connected between the first side edge 2301 and the second side edge 2302, the first side edge 2301 is located at one side close to the active area 100 and the second side edge 2302 is located at the other side away from the active area 100.

In an exemplary implementation, as shown in FIG. 3 or 4, the first gate drive circuit pin area 231 includes a first sub-gate drive circuit pin area 2311 and a second sub-gate drive circuit pin area 2312, which are located at one side close to the first side edge 2301, and the first sub-gate drive circuit pin area 2311 is located close to the third side edge 2303, and the second sub-gate drive circuit pin area 2312 is located close to the fourth side edge 2304.

In an exemplary implementation, as shown in FIG. 3 or 4, the first touch pin area 232 includes a first sub-touch pin area 2321 and a second sub-touch pin area 2322, the first sub-touch pin area 2321 is located at one side close to the third side edge 2303 and the second sub-touch pin area 2322 is located at one side close to the fourth side edge 2304.

In an exemplary implementation, as shown in FIG. 3 or 4, a distance between the first sub-touch pin area 2321 and the second side edge 2302 is smaller than a distance between the first sub-gate drive circuit pin area 2311 and the second side edge 2302; a distance between the second sub-touch pin area 2322 and the second side edge 2302 is smaller than a distance between the second sub-gate drive circuit pin area 2312 and the second side edge 2302.

In an exemplary implementation, as shown in FIG. 3 or 4, the second binding area 240 includes a fifth side edge 2401, a sixth side edge 2402 opposite to the fifth side edge 2401, and a seventh side edge 2403 and an eighth side edge 2404 connected between the fifth side edge 2401 and the sixth side edge 2402, the fifth side edge 2401 is located at one side close to the first binding area 230, and the sixth side edge 2402 is located at one side away from the first binding area 230.

The second gate drive circuit pin area 241 includes a third sub-gate drive circuit pin area 2411 and a fourth sub-gate drive circuit pin area 2412, the second touch pin area 243 includes a third sub-touch pin area 2431 and a fourth sub-touch pin area 2432. The third sub-gate drive circuit pin area 2411 and the third sub-touch pin area 2431 are located at one side of the second binding area 240 close to the seventh side edge 2403, and a distance between the third sub-gate drive circuit pin area 2411 and the seventh side edge 2403 is smaller than a distance between the third sub-touch pin area 2431 and the seventh side edge 2403; the fourth sub-gate drive circuit pin area 2412 and the fourth sub-touch pin area 2432 are located at one side of the second binding area 240 close to the eighth side 2404, and a distance between the fourth sub-gate drive circuit pin area 2412 and the eighth side edge 2404 is smaller than a distance between the fourth sub-touch pin area 2432 and the eighth side edge 2404.

In an exemplary implementation, as shown in FIG. 3, the second binding area 240 further includes a power pin area 242, wherein the power pin area 242 includes a first sub-power pin area 2421 and a second sub-power pin area 2422, the first sub-power pin area 2421 is disposed between the third sub-gate drive circuit pin area 2411 and the third sub-touch pin area 2431, and the second sub-power pin area 2422 is disposed between the fourth sub-gate drive circuit pin area 2412 and the fourth sub-touch pin area 2432.

In another exemplary implementation, as shown in FIG. 4, the second binding area 240 further includes a power pin area 242, wherein the power pin area 242 includes a first sub-power pin area 2421 and a second sub-power pin area 2422, the first sub-power pin area 2421 is disposed at one side of the third sub-gate drive circuit pin area 2411 close to the seventh side edge 2403, and the second sub-power pin area 2422 is disposed at one side of the fourth sub-gate drive circuit pin area 2412 close to the eighth side edge 2404.

In an exemplary implementation, as shown in FIG. 3 or 4, the first binding area 230 further includes an input pin area 233 and a first output pin area 234, wherein the input pin area 233 is disposed close to the second side edge 2302, the first output pin area 234 is disposed close to the first side edge 2301, and the first output pin area 234 is disposed between the first sub-gate drive circuit pin area 2311 and the second sub-gate drive circuit pin area 2312.

In an exemplary implementation, as shown in FIG. 3 or 4, the first output pin area 234 includes a first sub-output pin area 2341, a second sub-output pin area 2342 and a gap area (not shown in the figure) located between the first sub-output pin area 2341 and the second sub-output pin area 2342.

The first binding area 230 further includes a plurality of first touch leads 2381 and a plurality of second touch leads 2382. The first touch leads 2381 are connected to the touch electrodes 300 in the active area 100 after extending from the first sub-touch pin area 2321 and passing through the gap area; the second touch leads 2382 are connected to the touch electrodes 300 in the active area 100 after extending from the second sub-touch pin area 2322 and passing through the gap area.

Since the numbers of the first touch leads 2381 and the second touch leads 2382 need to be determined according to the actual resolution of the touch display substrate, not all of the first touch leads 2381 and the second touch leads 2382 are shown in FIGS. 3 and 4, and only one of the first touch leads 2381 and one of the second touch leads 2382 are shown, that is, the numbers of the first touch leads 2381 and the second touch leads 2382 shown in FIGS. 3 and 4 do not represent the actual numbers of the first touch leads 2381 and the second touch leads 2382.

FIG. 5 is an enlarged schematic structure diagram of the touch pin area in FIG. 3 or 4. In an exemplary implementation, as shown in FIG. 5, the first sub-touch pin area 2321 includes a plurality of first touch pins 23211, and one or more of the first touch pins 23211 are connected to the first touch leads 2381.

In an exemplary implementation, the second sub-touch pin area 2322 includes a plurality of second touch pins (not shown in FIG. 5), and one or more of the second touch pins are connected to the second touch leads 2382.

In an exemplary implementation, as shown in FIG. 5, the first binding area 230 further includes a plurality of virtual pins 23212, which can be disposed in or at any one or more of: the first sub-touch pin area 2321, the second sub-touch pin area 2322, one or both sides of the plurality of first touch leads 2381, and one or both sides of the plurality of second touch leads 2382.

In this embodiment, both the first touch pins 23211 that are not connected to the first touch leads 2381 and the second touch leads that are not connected to the second touch leads 2382 constitute the virtual pins, into which electrical signals are not introduced. The driver chip or FPC can be smoothly bound to a touch display panel by setting the virtual pins 23212, and the traces will not be crushed during the binding process.

In an exemplary implementation, as shown in FIG. 5, the plurality of first touch pins 23211 includes two or more than two columns of first touch pins, and the first touch pins in each column and the first touch pins in its adjacent columns are arranged alternately in a first direction D1.

In an exemplary implementation, the plurality of second touch pins includes two or more than two columns of first touch pins, and the second touch pins in each column and the second touch pins in its adjacent columns are arranged alternately in the first direction D1.

A binding margin of each pin in the first direction is increased by arranging the first touch pins or the second touch pins in the adjacent columns alternately in the first direction, so that the space for laying the leads at both sides of the first touch pins or the second touch pins become larger, and the display abnormity caused by short circuit of a plurality of wires connecting the first touch pins or the second touch pins is avoided.

FIG. 6 is a schematic sectional structure diagram of an area BB in FIG. 5. In an exemplary implementation, as shown in FIG. 6, in the plane perpendicular to the touch display substrate, both the first touch pins and the second touch pins include a first metal layer M1 disposed on the base 101, a second metal layer M2 disposed on the first metal layer M1, and a third metal layer M3 disposed on the second metal layer M2.

In an exemplary implementation, as shown in FIG. 6, in the plane perpendicular to the touch display substrate, both the first touch leads and the second touch leads include the first metal layer M1 disposed on the base 101.

In an exemplary implementation, the first metal layer M1 may be disposed at the same layer as the first gate metal layer and/or the second gate metal layer of the active area. The second metal layer M2 may be disposed at the same layer as a source-drain metal layer of the active area. The third metal layer M3 may be disposed at the same layer as the touch electrode layer of the active area.

In an exemplary implementation, the display unit may be a liquid crystal display unit or an OLED display unit, which is not limited in the present disclosure.

In an exemplary implementation, as shown in FIG. 7, the touch area includes a plurality of touch electrodes 300 arranged regularly. Exemplarily, the touch electrodes 300 may be rectangular and arranged in a matrix of M*N. The touch area 100 may be divided into N electrode regions 110 and N lead regions 120. The electrode regions 110 and lead regions 120 are strip-shaped regions extending along a second direction D2, and the strip-shaped electrode regions 110 and the strip-shaped lead regions 120 are alternately disposed along the first direction D1, i.e., except electrode regions and lead regions at edge positions, one lead region 120 is disposed between two electrode regions 110 and one electrode region 110 is disposed between two lead regions 120. Each electrode region 110 includes M touch electrodes 300 arranged sequentially along the second direction D2, and each lead region 120 includes M touch traces 310 arranged sequentially along the first direction D1. A first end of each touch trace 310 is connected to one touch electrode 300, and its second end extends to the second peripheral area 200 along the second direction D2.

In an exemplary implementation, the touch electrodes 300 may be of a regular pattern of about 4 mm*4 mm or 5 mm*5 mm, which may be a rectangle, a rhombus, a triangle or a polygon. During operation, a touch of a human finger will cause changes in self-capacitance of the corresponding touch electrodes, and an external control device can determine a position of the finger according to the changes in the capacitance of the touch electrodes.

In the exemplary implementation, as shown in FIG. 7, the second peripheral area 200 may include a trace lead-out area 210, a bending area 220, a first binding area 230, and a second binding area 240 which are disposed sequentially, along the second direction D2 (i.e., the direction away from the touch area). A plurality of fold lines may be provided in the trace lead-out area 210. First ends of the plurality of fold lines are connected respectively to the plurality of touch traces 310 in the touch area, and their second ends extend towards the bending area 220 and are connected respectively to a plurality of connecting lines provided in the bending area 220. The bending area 220 is configured to bend the first binding area 230 and the second binding area 240 of the second peripheral area 200 towards the back of the touch area 100. A touch and display driver integration (TDDI) circuit, a plurality of output lines and a plurality of input lines can be provided in the first binding area 230. The TDDI circuit is used to control touch and display functions. A plurality of pins may be provided in the second binding area 240, the TDDI circuit is connected to part of the plurality of pins through the plurality of input lines. The plurality of pins is configured to be connected to an external control device by binding a flexible printed circuit board (FPC).

In an exemplary implementation, the first touch pin area includes a plurality of touch pins (not shown in FIG. 7), which are connected to the aforementioned first touch leads 2381 or second touch leads 2382. The first touch leads 2381 and second touch leads 2382 are respectively connected to the plurality of touch traces 310 in the active area, and are connected to the touch electrodes in the touch area through the first touch leads 2381 or the second touch leads 2382 and the touch traces 310.

In an exemplary implementation, the second touch pin area includes a plurality of touch test pins (not shown in FIG. 7), which are respectively connected to a plurality of touch pins in the first touch pin area for testing the ouch electrodes.

In an exemplary implementation, as shown in FIG. 8, the display area includes a plurality of sub-pixels 1 for display, each sub-pixel 1 is the smallest point that can independently emit light of required brightness and colors, the plurality of sub-pixels 1 can usually form a "pixel" that can display light of any color and brightness, and each "pixel" is a "point" in an image to be displayed.

Leads for providing drive signals to the sub-pixels 1, such as data lines 81 for providing data signals (data voltages) to the sub-pixels 1, are also provided in the display area. In some embodiments, other leads, such as gate lines 82 and control electrode lines 83, are also provided in the display area.

In some exemplary embodiments, as shown in FIG. 8, the first peripheral area 201 includes a gate drive circuit 2011, which is electrically connected to a plurality of gate lines 82 and configured to provide gate drive signals to the plurality of gate lines 82.

In some exemplary embodiments, as shown in FIG. 8, the first peripheral area 201 further includes a control electrode drive circuit 2012, which is electrically connected to a plurality of control electrode lines 83 and configured to provide control electrode drive signals to the plurality of control electrode lines 83.

In some exemplary embodiments, the sub-pixels 1 in the display area are arranged in a matrix, that is, in multiple rows and multiple columns. The data lines 81 are all parallel to the column direction, and each of the data line 81 is electrically connected to one column of sub-pixels 1; the gate lines 82 are all parallel to the row direction, and each of the gate line 82 is electrically connected to one row of sub-pixels 1; the control electrode lines are all parallel to the row direction, and each of the control electrode line 83 is electrically connected to one row of sub-pixels 1.

Therefore, when a frame of image is displayed, turn-on signals (signals enabling transistors to be turned on) may be led to each of the gate lines 82 in turn (time-division). When the turn-on signals are led to each of the gate lines 82, each data line 81 writes a data signal into each sub-pixel 1 (such as a row of sub-pixels 1) electrically connected to the gate line 82, and stores the data signal in a storage capacitor Cst, such that the sub-pixel 1 is displayed during the remaining time of the frame according to the stored data signal. The control electrode lines 83 are used to control whether the sub-pixels 1 are allowed to emit light or not.

The "row" direction and the "column" direction are two opposite directions, which can be perpendicular to each other. In some drawings, the row direction being horizontal (left-right direction) and the column direction being vertical (up-down direction) is described as an example, but it should be understood that the horizontal and vertical directions are not restrictions on rows and columns, and rows and columns are also not necessarily related to the placement position of the display unit.

In some embodiments, a pixel circuit is provided in each sub-pixel 1 to allow the sub-pixel 1 to emit light.

Exemplarily, referring to FIG. 9, the structure of the pixel circuit is a 7T1C structure, which includes a first transistor T1, a second transistor T2, a drive transistor T3 (a third transistor), a fourth transistor T4, a fifth transistor T5, a sixth transistor T6, a seventh transistor T7, a storage capacitor Cst, an organic light emitting diode (OLED), a first reset terminal Reset, a second reset terminal Reset', an initialization terminal Vinit, a gate line terminal Gate, a data line terminal Data, a control electrode line terminal EM, a positive terminal VDD, a negative terminal VSS, etc. Each of the transistors may be a P-type transistor (for example PMOS) or an N-type transistor (for example NMOS).

The positive terminal VDD is electrically connected to a positive signal source (for example, via a positive line), the negative terminal VSS is electrically connected to a negative signal source (for example, a cathode layer of the organic light emitting diode (OLED) (as shown in FIG. 2) is directly connected to the negative signal source), the control electrode line terminal EM is connected to the control electrode lines 83, the gate line terminal Gate is connected to the gate lines 82, and the data line terminal Data is connected to the data lines 81. Other terminals are also electrically connected to the corresponding signal sources.

In the above pixel circuit, an appropriate data signal is written to a source of the drive transistor T3, that is, a current flowing through the drive transistor T3 can be controlled, so as to control the organic light emitting diode (OLED) to emit light with corresponding brightness to implement the display of the sub-pixels 1.

Of course, the specific structures of the sub-pixels 1 and the pixel circuit are not limited to the structure described above.

In an exemplary implementation, as shown in FIG. 10, the first gate drive circuit pin area 231 includes a plurality of gate on array pins 2310, which are respectively connected to gate drive lines 237 (connecting lines are not shown in the figure), which extend to the first peripheral area 201 and are connected to the gate drive circuit 2011 in the first peripheral area 201. The gate drive circuit 2011 includes a plurality of shift register units, each of which is connected to one gate line 82 in the display area to provide gate drive signals for each row of sub-pixels 1 in an array of pixels. In an exemplary implementation, the control electrode drive lines (not shown in the figure) can be connected to the control electrode drive circuit 2012 in the first peripheral area 201. The control electrode drive circuit 2012 includes a plurality of shift register units, each of which is connected to one control electrode line 83 in the display area to provide control electrode drive signals for each row of sub-pixels 1 in the array of pixels.

In an exemplary implementation, as shown in FIG. 10, the first output pin area 234 includes a plurality of data pins 2340, which are respectively connected to a plurality of data lines 81 in the display area (connecting lines are not shown in the figure) to provide data drive signals for each column of sub-pixels 1 in the array of pixels.

In an exemplary implementation, as shown in FIG. 10, the input pin area 233 includes a plurality of first input pins 2330, at least one of which is connected to a second output pin 2440 in the second binding area 240 (connecting lines are not shown in the figure).

In an exemplary implementation, as shown in FIGS. 10 and 11, the power pin area 242 includes a plurality of power pins 2420, which are respectively connected to a plurality of power lines in the display area 100 and the first peripheral area 201. The power lines include a first power line 2423 and a second power line 2424. Exemplarily, the first power line 2423 may be a positive voltage power line (ELVDD), and the second power line 2424 may be a negative voltage power line (ELVSS). In an exemplary embodiment, the first power line 2423 is located in the display area 100 and electrically connected to the plurality of sub-pixels 1, and the second power line 2424 is located in the first peripheral area 201 and surrounds the display area 100.

In an exemplary implementation, as shown in FIG. 11, in order to reduce signal crosstalk, the array test leads 235 can be arranged on the same layer as one or more of the first gate metal layer and the second gate metal layer, and the touch test leads 236 can be arranged on the same layer as the source-drain metal layer.

In an exemplary implementation, as shown in FIG. 11, the first power line 2423 and the second power line 2424 may be arranged on the same layer as the source-drain metal layer.

In an exemplary implementation, as shown in FIG. 11, the orthographic projection of the array test leads 235 on the base overlaps with an orthographic projection of one or more of the first power line 2423 and the second power line 2424 on the base.

In an exemplary implementation, as shown in FIG. 11, the second peripheral area 200 includes a first area A1 and a second area A2. The first area A1 is located between the second binding area 240 and the second area A2, and a distance between the array test leads 235 and the touch test leads 236 in the first area A1 is smaller than a distance between the array test leads 235 and the touch test leads 236 in the second area A2.

In an exemplary implementation, as shown in FIG. 11, in the first area A1, the orthographic projection of one or more of the first power line 2423 and the second power lines 2424 on the base is located between the orthographic projection of the array test leads 235 on the base and the orthographic projection of the touch test leads 236 on the base.

In an exemplary implementation, as shown in FIG. 10, the second gate drive circuit pin area 241 includes a plurality of gate test pins 2410, which are respectively electrically connected to a plurality of gate on array pins 2310 in the first gate drive circuit pin area 231 (connecting lines are not shown in the figure) for testing the plurality of gate lines or the plurality of control electrode lines.

In an exemplary implementation, as shown in FIG. 10, the second touch pin area 243 includes a plurality of touch test pins 2430, which are respectively electrically connected to a plurality of first touch pins 23211 in the first sub-touch pin area 2321 or a plurality of second touch pins 23221 in the second sub-touch pin area 2322 (connecting lines are not shown in the figure) for testing the plurality of touch electrodes.

In an exemplary implementation, as shown in FIG. 10, the second output pin area 244 includes a plurality of second output pins 2440, which are respectively connected to a plurality of first input pins 2330 (connecting lines are not shown in the figure).

In an exemplary implementation, as shown in FIG. 10, the plurality of first input pins 2330 are arranged along the second side edge 2302, that is, a distance between each first input pin 2330 and the second side edge 2302 is smaller than a distance between the first input pin 2330 and the first side edge 2301.

In an exemplary implementation, as shown in FIG. 10, a plurality of data pins 2340 and a plurality of gate on array pins 2310 are arranged along the first side edge 2301, and the plurality of gate on array pins 2310 are arranged at both sides of the plurality of data pins 2340 along the first direction D1.

In an exemplary implementation, as shown in FIG. 10, a plurality of first touch pins 23211 are arranged along the third side edge 2303 and a plurality of second touch pins 23221 are arranged along the fourth side edge 2304.

In an exemplary implementation, as shown in FIG. 10, each pin in the power pin area 242, the second gate drive circuit pin area 241, the second touch pin area 243 and the second output pin area 244 may be arranged in a row along the first direction D1.

Since the numbers of gate on array pins 2310, first touch pins 23211, second touch pins 23221, data pins 2340, first input pins 2330, gate test pins 2410, power pins 2420, touch test pins 2430 and second output pins 2440 need to be determined according to the actual resolution of the touch display substrate, not all not all of the first touch pins 23211, the second touch pins 23221, the data pins 2340, the first input pins 2330, the gate test pins 2410, the power pins 2420, the touch test pins 2430 and the second output pins 2440 are shown in FIG. 10, and only part of the first touch pins 23211, the second touch pins 23221, the data pins 2340, the first input pins 2330, the gate test pins 2410, the power pins 2420, the touch test pins 2430 and the second output pins 2440 are shown, that is, the numbers of the first touch pins 23211, the second touch pins 23221, the data pins 2340, the first input pins 2330, the gate test pins 2410, the power pins 2420, the touch test pins 2430 and the second output pins 2440 shown in FIGS. 3 and 4 do not represent the actual numbers of the first touch pins 23211, the second touch pins 23221, the data pins 2340, the first input pins 2330, the gate test pins 2410, the power pins 2420, the touch test pins 2430 and the second output pins 2440.

A process of manufacturing the touch display substrate will be exemplarily described below. "Patterning processes" mentioned in the present disclosure include photoresist coating, mask exposure, development, etching, photoresist stripping, etc., for metal materials, inorganic materials or transparent conducting materials, and includes organic material coating, mask exposure, development, etc., for organic materials. Deposition may be implemented using any one or more of sputtering, evaporation and chemical vapor deposition. Coating may be implemented using any one or more of spray coating, spin coating and inkjet printing, and etching may be implemented using any one or more of dry etching and wet etching, which are not limited in the present disclosure. "Thin film" refers to a layer of thin film formed by a certain material on a base using deposition, coating or other processes. If the "thin film" does not need the patterning processes in the entire manufacturing process, the "thin film" may also be called a "layer". If the "thin film" needs the patterning processes in the entire manufacturing process, the "thin film" is called a "thin film" before the patterning processes and is called a "layer" after the patterning processes. The "layer" processed by the patterning processes includes at least one "pattern". "A and B are disposed on the same layer" in the present disclosure means that A and B are formed simultaneously through the same running of the patterning processes, and the "thickness" of the film layer is the size of the film layer in a direction perpendicular to the touch display substrate. In an exemplary embodiment of the present disclosure, "an orthographic projection of A contains an orthographic projection of B" means that the boundary of the orthographic projection of B falls within the boundary range of the orthographic projection of A, or the boundary of the orthographic projection of A overlaps with the boundary of the orthographic projection of B.

(1) The base 101 is manufactured on a glass carrier board. In an exemplary implementation, the base 101 may include a first flexible material layer, a first inorganic material layer, a semiconductor layer, a second flexible material layer and a second inorganic material layer stacked on the glass carrier board. Materials of the first and second flexible material layers may be polyimide (PI), polyethylene terephthalate (PET) or surface treated polymer soft films; materials of the first and second inorganic material layers may be silicon nitride (SiNx) or silicon oxide (SiOx), for improving the water and oxygen resistance of the base, and the first and second inorganic material layers may also be called barrier layers; and a material of the semiconductor layer may be amorphous silicon (a-si). In an exemplary implementation, taking a stacked structure PI1/Barrier1/a-si/PI2/Barrier2 as an example, its manufacturing process may include: firstly coating a layer of polyimide on a glass carrier board, and curing it into a film to form a first flexible (PI1) layer; then depositing a layer of barrier thin film on the first flexible layer to form a first barrier (Barrier1) layer overlying the first flexible layer; then depositing a layer of amorphous silicon thin film on the first barrier layer to form an amorphous silicon (a-si) layer overlying the first barrier layer; then coating a layer of polyimide on the amorphous silicon layer, and curing it into a film to form a second flexible (PI2) layer; and then depositing a barrier thin film on the second flexible layer to form a second barrier (Barrier2) layer overlying the second flexible layer, thus completing the manufacturing of the base 101.

In an exemplary implementation, the base 101 may be a rigid base.

(2) A first insulating thin film and an active layer thin film are sequentially deposited on the base 101, and the active layer thin film is patterned through the patterning processes to form a first insulating layer overlying the whole base 101 and patterns of the active layer disposed on the first insulating layer. After this running of the patterning processes, the second peripheral area includes the first insulating layer disposed on the base 101.

(3) A second insulating thin film and a first metal thin film are sequentially deposited, and the first metal thin film is patterned through the patterning processes to form a second insulating layer overlying the patterns of the active layer and patterns of the first gate metal layer disposed on the second insulating layer. The patterns of the first gate metal layer at least include a first gate electrode and a first capacitor electrode which are formed in the active area 100. After this running of the patterning processes, the second peripheral area includes the first insulating layer disposed on the base 101 and the second insulating layer disposed on the first insulating layer.

(4) A third insulating thin film and a second metal thin film are sequentially deposited, and the second metal thin film is patterned through the patterning processes to form a third insulating layer overlying the first gate metal layer and patterns of the second gate metal layer and the first metal layer disposed on the third insulating layer. The patterns of the second gate metal layer at least include a second capacitor electrode, the first metal layer includes the first touch leads 2381, the second touch leads 2382, the array test leads 235 and the touch test leads 236, the second capacitor electrode is formed in the active area 100, a position of the second capacitor electrode corresponds to a position of the first capacitor electrode, and the first touch leads 2381, the second touch leads 2382, the array test leads 235 and the touch test leads 236 are formed in the second peripheral area 200. The first touch leads 2381 are used to connect the touch pins in the first touch pin area 2321 with the touch electrodes in the active area, and the second touch leads 2382 are used to connect the touch pins in the second touch pin area 2322 with the touch electrodes in the active area; the touch test leads 236 are used to connect the touch pin area 232 with the second touch pin area 243, the array test leads 235 are used to connect the first gate drive circuit pin area 231 with the second gate drive circuit pin area 241, and the orthographic projection of the array test leads 235 on the base does not overlap with the orthographic projection of the touch test leads 236 on the base. The first metal layer also includes patterns of the first metal layer in each pin constituting the second peripheral area.

(5) A fourth insulating thin film is deposited and patterned through the patterning processes to form patterns of a fourth insulating layer overlying the second gate metal layer. A plurality of via holes are formed in the fourth insulating layer, and at least includes two first active via holes.

In an exemplary implementation, the two first active via holes are formed in the active area 100, and the fourth insulating layer, the third insulating layer and the second insulating layer in the two first active via holes are etched away to expose a surface of a first active layer. The two first active via holes are used to connect a source electrode and a drain electrode formed subsequently with the first active layer respectively.

(6) A third metal thin film is deposited and patterned through the patterning processes to form patterns of a first source-drain metal layer and a second metal layer on the fourth insulating layer. The first source-drain metal layer at least includes a source electrode and a drain electrode. The source electrode and the drain electrode are formed in the active area 100, and are connected to the first active layer through the first active via holes respectively.

The second metal layer is formed in the first binding area 230 and the second binding area 240, and includes patterns of the second metal layer in each pin constituting the second peripheral area.

(7) A first planarization thin film of organic material is coated on the base, on which the forementioned patterns are formed, to form a first planarization (PLN) layer overlying the active area, and anode via holes are formed in the first planarization layer through the patterning processes, such as masking, exposure, and development. The anode via holes are formed in the active area, and the first planarization layer in the anode via holes is removed to expose a surface of the drain electrode of the drive transistor.

So far, preparation of the patterns of the drive structure layers on the base is achieved. In the active area, the first active layer, the first gate electrode, the source electrode and the drain electrode form a drive transistor in a pixel drive circuit, and the first capacitor electrode and the second capacitor electrode form a storage capacitor in the pixel drive circuit.

(8) Patterns of a light emitting element in the active area are formed on the base, on which the forementioned patterns are formed. In an exemplary implementation, the patterns of the light emitting element may include an anode, a pixel definition (PDL) layer, spacer posts (PS), an organic light emitting layer, and a cathode. The anode is provided on the first planarization layer, and is connected to the drain electrode of the drive transistor through the via holes formed in the first planarization layer; the pixel definition layer is provided on the anode and the planarization layer, and a pixel opening is provided in the pixel definition layer and exposes the anode; at least part of the organic light emitting layer is disposed in the pixel opening, and the organic light emitting layer is connected to the anode; the cathode is provided on the organic light emitting layer, and is connected to the organic light emitting layer; the organic light emitting layer emits light of corresponding colors under driving of the anode and the cathode.

(9) Patterns of an encapsulation layer are formed on the base, on which the forementioned patterns are formed. The encapsulation layer may include a first encapsulation layer, a second encapsulation layer and a third encapsulation layer which are stacked. The first encapsulation layer and the third encapsulation layer may be made of inorganic materials, and the second encapsulation layer may be made of an organic material.

(10) A fourth metal thin film is deposited on the base, on which the forementioned patterns are formed, and the fourth metal thin film is patterned through the patterning processes to form patterns of a touch electrode layer and a third metal layer. In the active area 100, the touch electrode layer includes a plurality of touch electrodes and a plurality of touch traces. In the second peripheral area 200, the third metal layer includes patterns of the third metal layer in each pin constituting the second peripheral area. In an exemplary embodiment, each pin in the second peripheral area is formed by sequential stacking of the first metal layer, the second metal layer and the third metal layer, the first metal layer is connected to the second metal layer, the second metal layer is connected to the third metal layer, and heights of all pins (including virtual pins and non-virtual pins, the virtual pins referring to pins into which electric signals are not introduced, and the non-virtual pins referring to pins into which electric signals are introduced) are consistent, thereby ensuring that the driver chip or FPC can be smoothly bound on the touch display panel.

In an exemplary implementation, the first insulating layer, the second insulating layer, the third insulating layer and the fourth insulating layer may be made of any one or more of silicon oxide (SiOx), silicon nitride (SiNx) and silicon oxynitride (SiON), and may be a single layer, multiple layers or a composite layer. The first insulating layer is referred to as a buffer layer for improving the water and oxygen resistance of the base, the second and the third insulating layers are referred to as gate insulating (GI) layers, and the fourth insulating layer is referred to as a interlayer insulating (ILD) layer. The first metal thin film, the second metal thin film, the third metal thin film and the fourth metal thin film may be made of metal materials, such as any one or more of silver (Ag), copper (Cu), aluminum (Al), titanium (Ti) and molybdenum (Mo), or alloy materials of the above metals, such as AlNd alloy or MoNb alloy, and may be a single-layer structure or a multilayer composite structure, such as Ti/Al/Ti, etc. The active layer thin film may be made of various materials, such as amorphous indium gallium zinc oxide (a-IGZO), zinc oxynitride (ZnON), indium zinc tin oxide (IZTO), amorphous silicon (a-Si), polycrystalline silicon (p-Si), sexithiophene and polythiophene, that is, the present disclosure is applicable to transistors manufactured based on oxide technology, silicon technology and organic technology.

It can be seen from the structure of the touch display substrate and the manufacturing process thereof in accordance with the exemplary embodiments of the present disclosure that in the exemplary embodiments of the present disclosure, the orthographic projection of the array test leads on the base does not overlap with the orthographic projection of the touch test leads on the base, so that the problem of signal crosstalk caused by the intersection of the touch traces and gate on array traces is avoided, improving the touch performance.

The structure of the touch display substrate and the manufacturing process thereof in accordance with the exemplary embodiments of the present disclosure are only an exemplary description. In the exemplary embodiments, the corresponding structure may be changed and the patterning processes may be increased or decreased according to the actual needs, which is not limited in the present disclosure.

The present disclosure also provides a method of manufacturing a touch display substrate, wherein the touch display substrate includes an active area and a first peripheral area and a second peripheral area located at peripheries of the active area, wherein the second peripheral area includes a first binding area used for binding a driver chip and a second binding area located at one side of the first binding area away from the active area and used for binding a flexible circuit board, the first binding area includes a first gate drive circuit pin area and a first touch pin area, the second binding area includes a second gate drive circuit pin area electrically connected to the first gate drive circuit pin area and a second touch pin area electrically connected to the first touch pin area; the method includes:

forming touch test leads and array test leads in the second peripheral area, wherein the touch test leads connect the first touch pin area with the second touch pin area, the array test leads connect the first gate drive circuit pin area with the second gate drive circuit pin area, and an orthographic projection of the array test leads on the base does not overlap with an orthographic projection of the touch test leads on the base.

In an exemplary embodiment, in a plane perpendicular to the touch display substrate, the touch display substrate may include a base, an active layer disposed on the base, a first insulating layer disposed on the active layer, a first gate metal layer disposed on the first insulating layer, a second insulting layer disposed on the first gate metal layer, a second gate metal layer disposed on the second insulating layer, a third insulating layer disposed on the second gate metal layer and a first source-drain metal layer disposed on the third insulating layer.

The array test leads are arranged in the same layer as one or more of the first gate metal layer and the second gate metal layer, and the touch test leads are arranged in the same layer as the source and drain metal layer.

An embodiment of the present disclosure further provides a touch display device which includes the touch display substrate in accordance with the aforementioned embodiments. The touch display device of the present disclosure may be any product or component with a display function, such as a mobile phone, a tablet computer, a television, a display, a notebook computer, a digital photo frame, or a navigator. In an exemplary implementation, the touch display device may be a wearable display device that can be worn on a human body in some manners, such as a smart watch, a smart wristband, etc.

The drawings of the present disclosure are only related to the structures involved in the present disclosure, and the other structures may be made with reference to usual designs. The embodiments of the present disclosure, i.e., features in the embodiments, can be combined with each other without conflicts, to obtain new embodiments.

Those of ordinary skill in the art should understand that modifications or equivalent substitutions to the technical schemes of the present disclosure, which may be made without departing from the spirit and scope of the technical schemes of the present disclosure, shall all fall within the scope of the claims of the present disclosure.

The invention claimed is:

1. A touch display substrate, comprising an active area and a first peripheral area and a second peripheral area located at peripheries of the active area, wherein:

the active area comprises a base, and a display unit and a touch unit stacked on the base, the display unit comprises a plurality of data lines, a plurality of gate lines and a plurality of sub-pixels, and the touch unit comprises a plurality of touch electrodes and touch leads connected to the touch electrodes;

the first peripheral area comprises a gate drive circuit connected to the plurality of gate lines;

the second peripheral area comprises a first binding area used for binding a driver chip and a second binding area located at one side of the first binding area away from the active area and used for binding a flexible circuit board;

the first binding area comprises a first gate drive circuit pin area and a first touch pin area;

the second binding area comprises a second gate drive circuit pin area electrically connected to the first gate drive circuit pin area and a second touch pin area electrically connected to the first touch pin area; and the second peripheral area further comprises touch test leads connecting the first touch pin area with the second touch pin area, and array test leads connecting the first gate drive circuit pin area with the second gate drive circuit pin area, and an orthographic projection of the array test leads on the base does not overlap with an orthographic projection of the touch test leads on the base;

wherein the first binding area comprises a first side edge, a second side edge opposite to the first side edge, and a third side edge and a fourth side edge connected between the first side edge and the second side edge, the first side edge is located at one side close to the active area and the second side edge is located at the other side away from the active area;

the first gate drive circuit pin area comprises a first sub-gate drive circuit pin area, the first sub-gate drive circuit pin area is located at one side close to the first side edge, and the first sub-gate drive circuit pin area is disposed close to the third side edge or the fourth side edge; and the first touch pin area comprises a first sub-touch pin area, the first sub-touch pin area is located at one side close to the third side edge or the fourth side edge, and a distance between the first sub-touch pin area and the second side edge is smaller than a distance between the first sub-gate drive circuit pin area and the second side edge.

2. The touch display substrate according to claim 1, wherein the first binding area further comprises an input pin area and a first output pin area, wherein the input pin area is disposed close to the second side edge and the first output pin area is disposed close to the first side edge.

3. The touch display substrate according to claim 2, wherein the first output pin area comprises a first sub-output pin area and a gap area located at one side of the first sub-output pin area; and the first binding area further comprises a plurality of first touch leads, and the first touch leads are connected to the touch electrodes in the active area after extending from the first sub-touch pin area and passing through the gap area.

4. The touch display substrate according to claim 3, wherein the first binding area further comprises a plurality of virtual pins, and the virtual pins are disposed in or at any one or more of: the first sub-touch pin area and one side or both sides of at least one of the first touch leads.

5. The touch display substrate according to claim 3, wherein the first sub-touch pin area comprises a plurality of first touch pins, and one or more of the plurality of first touch pins are connected to the first touch leads.

6. The touch display substrate according to claim 5, wherein the plurality of first touch pins comprises two or more than two columns of first touch pins, and the first touch pins in each column and the first touch pins in its adjacent columns are arranged alternately in a first direction.

7. The touch display substrate according to claim 5, wherein in a plane perpendicular to the touch display substrate, the first touch pins comprise a first metal layer disposed on the base, a second metal layer disposed on the first metal layer, and a third metal layer disposed on the second metal layer; and in the plane perpendicular to the touch display substrate, the first touch leads comprise the first metal layer disposed on the base.

8. The touch display substrate according to claim 1, wherein the second binding area comprises a fifth side edge, a sixth side edge opposite to the fifth side edge, and a seventh side edge and an eighth side edge connected between the fifth side edge and the sixth side edge, the fifth side edge is located at one side close to the first binding area and the sixth side edge is located at the other side away from the first binding area;

the second gate drive circuit pin area comprises a third sub-gate drive circuit pin area, and the second touch pin area comprises a third sub-touch pin area; and the third sub-gate drive circuit pin area and the third sub-touch pin area are located at one side of the second binding area close to the seventh side edge, and a distance between the third sub-gate drive circuit pin area and the seventh side edge is smaller than a distance between the third sub-touch pin area and the seventh side edge.

9. The touch display substrate according to claim 8, wherein the second binding area further comprises a power pin area, wherein the power pin area is located between the third sub-gate drive circuit pin area and the third sub-touch pin area.

10. The touch display substrate according to claim 9, further comprising a first power line and a second power line, the first power line extends from the power pin area to the active area, and the second power line extends from the power pin area to the first peripheral area; and the orthographic projection of the array test leads on the base overlaps with an orthographic projection of one or more of the first power line and the second power line on the base.

11. The touch display substrate according to claim 10, wherein the second peripheral area comprises a first area and a second area, the first area is located between the second binding area and the second area, and a distance between the array test leads and the touch test leads in the first area is smaller than a distance between the array test leads and the touch test leads in the second area.

12. The touch display substrate according to claim 11, wherein in the first area, the orthographic projection of one or more of the first power line and the second power line on the base is located between the orthographic projection of the array test leads on the base and the orthographic projection of the touch test leads on the base.

13. A touch display device comprising the touch display substrate according to claim 1.

14. A manufacturing method for a touch display substrate, wherein the touch display substrate comprises an active area and a first peripheral area and a second peripheral area located at peripheries of the active area, the second peripheral area comprises a first binding area used for binding a driver chip and a second binding area located at one side of the first binding area away from the active area and used for binding a flexible circuit board, the first binding area comprises a first gate drive circuit pin area and a first touch pin area, the second binding area comprises a second gate drive circuit pin area electrically connected to the first gate drive circuit pin area and a second touch pin area electrically connected to the first touch pin area; the method comprises:

forming touch test leads and array test leads in the second peripheral area, wherein the touch test leads connect the first touch pin area with the second touch pin area, the array test leads connect the first gate drive circuit pin area with the second gate drive circuit pin area, and an orthographic projection of the array test leads on the base does not overlap with an orthographic projection of the touch test leads on the base;

wherein the first binding area comprises a first side edge, a second side edge opposite to the first side edge, and a third side edge and a fourth side edge connected between the first side edge and the second side edge, the first side edge is located at one side close to the active area and the second side edge is located at the other side away from the active area;

the first gate drive circuit pin area comprises a first sub-gate drive circuit pin area, the first sub-gate drive circuit pin area is located at one side close to the first side edge, and the first sub-gate drive circuit pin area is disposed close to the third side edge or the fourth side edge; and the first touch pin area comprises a first sub-touch pin area, the first sub-touch pin area is located at one side close to the third side edge or the fourth side edge, and a distance between the first sub-touch pin area and the second side edge is smaller than a distance between the first sub-gate drive circuit pin area and the second side edge.

\* \* \* \* \*